United States Patent [19]
Shigehara et al.

[11] Patent Number: 5,442,307
[45] Date of Patent: Aug. 15, 1995

[54] INTERFACE CIRCUIT WITH BACKGATE BIAS CONTROL OF A TRANSISTOR

[75] Inventors: Hiroshi Shigehara, Tokyo; Masanori Kinugasa, Yokohama, both of Japan

[73] Assignee: Kabushiki Kaisha Toshiba, Japan

[21] Appl. No.: 226,683

[22] Filed: Apr. 12, 1994

[30] Foreign Application Priority Data

Apr. 12, 1993 [JP] Japan .................................. 5-084507

[51] Int. Cl.$^6$ ........................................ H03K 19/0185
[52] U.S. Cl. ........................................ 326/81; 327/537; 326/24
[58] Field of Search ............... 307/475, 473, 451, 443, 307/296.2, 572, 577, 579; 326/24, 80, 81, 121; 327/534, 537

[56] References Cited

U.S. PATENT DOCUMENTS

| | | | |
|---|---|---|---|
| 3,720,848 | 3/1973 | Schmidt, Jr. | 307/579 |
| 4,529,897 | 7/1985 | Sukuki et al. | 307/296.2 |
| 5,191,244 | 3/1993 | Runaldue | 307/475 |

FOREIGN PATENT DOCUMENTS

520470A2 12/1992 European Pat. Off. .

OTHER PUBLICATIONS

*Nikkei Microdevices*, Jun./1992, pp. 63–64 (Japanese).

*Primary Examiner*—Edward P. Westin
*Assistant Examiner*—Benjamin D. Driscoll
*Attorney, Agent, or Firm*—Banner & Allegretti, Ltd.

[57] ABSTRACT

An interface circuit includes first and second MOS transistors of depletion type, first and second switching elements, and a control circuit. The current path of the first MOS transistor is connected between an output node of a MOS circuit formed in a semiconductor substrate and an output terminal and the gate thereof is connected to a power supply. The first switching element is connected between the backgate of the first MOS transistor and a ground terminal. The second switching element and the current path of the second MOS transistor are serially connected between the backgate of the first MOS transistor and the output terminal. The gate of the second MOS transistor is connected to the power supply and the backgate thereof is connected to the backgate of the first MOS transistor. The first and second switching elements are set into complementary states according to an output of the MOS circuit in response to an output signal of the control circuit.

24 Claims, 7 Drawing Sheets

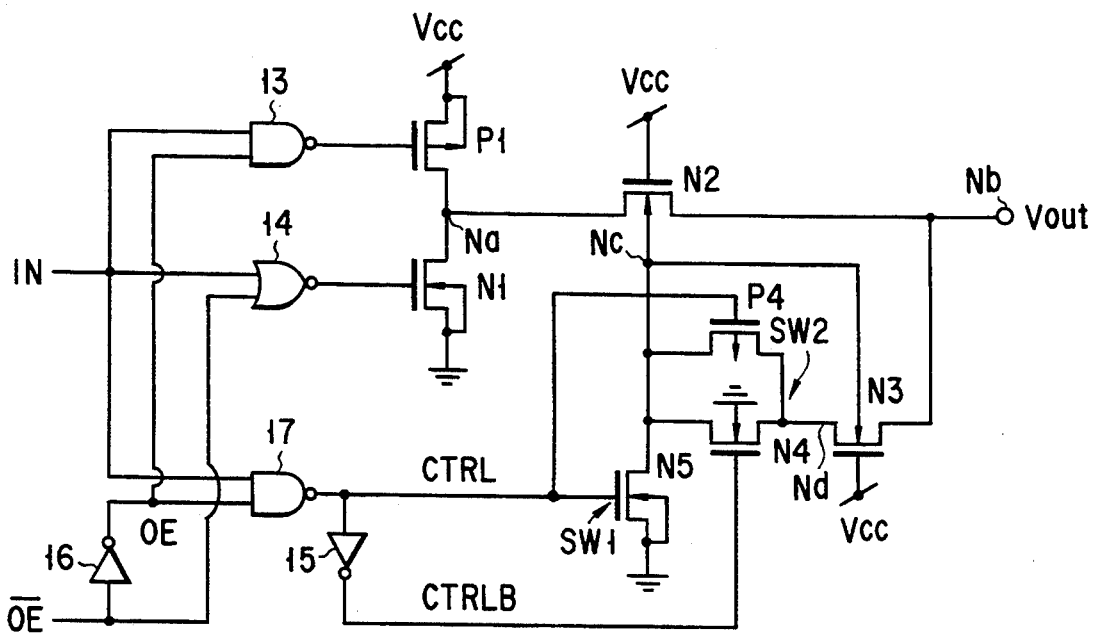
F I G. 5
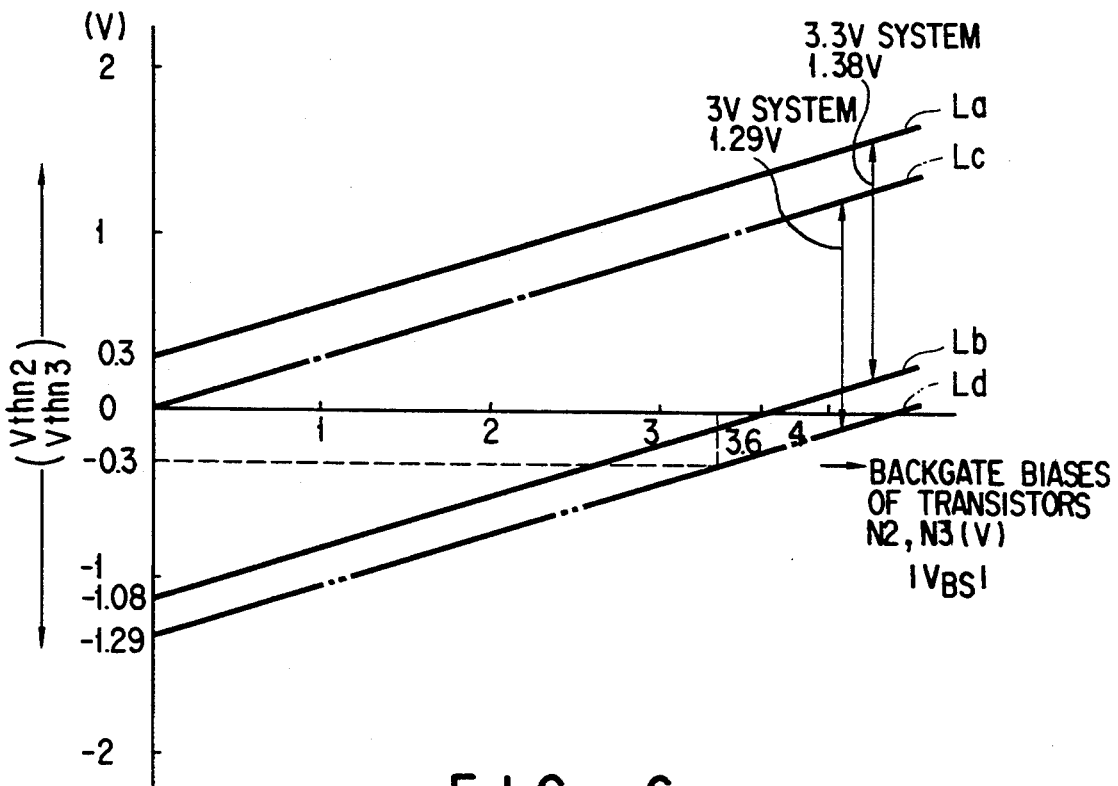
F I G. 6

INTERFACE CIRCUIT WITH BACKGATE BIAS CONTROL OF A TRANSISTOR

BACKGROUND OF THE INVENTION

1. Field of the Invention

This invention relates to an interface circuit in a semiconductor integrated circuit (IC), and more particularly to an interface circuit serving as an interface between a circuit of high power supply voltage system and a circuit of low power supply voltage system which commonly use a bus line.

2. Description of the Related Art

Conventionally, semiconductor elements formed based on the 0.8 micron design rule, for example, are operated on a power supply voltage of 5V. In contrast, it is intended that semiconductor elements formed by the fine pattern technology based on the 0.5 micron design rule, for example, are operated on a power supply voltage of 3.3V or 3.0V since the gate oxide film thereof is made thin and the withstanding voltage thereof is lowered (generally, it is estimated to be 3.6V).

In a case where an IC which is forced to be operated on a low power supply voltage because of a reduction in the withstanding voltage due to miniaturization of the elements is used together with an IC of 5V system, the IC of low power supply voltage system is sometimes used in an interface circuit with a signal system having a signal amplitude (for example, 5V) higher than the withstanding voltage thereof.

FIG. 1 schematically shows the construction of a circuit in which an IC of low power supply voltage (for example, 3.3V) system and an IC of high power supply voltage (for example, 5V) system commonly use a bus line. An IC 91 of 3.3V system and ICs 92-1, 92-2 of 5V system are connected together via a bus line 93. In the IC 91, an output circuit 91a operated on a power supply voltage of 3.3V is provided, and in the IC 92-1, an output circuit 92a operated on a power supply voltage of 5V is provided. The output circuits 91a, 92a are supplied with output enable signals $\overline{OE}$, OE respectively and the output states thereof are controlled. Further, in the IC 92-2, an input circuit 92b operated on a power supply voltage of 5V is provided.

With the above construction, a voltage of 5V is applied from the output circuit 92a to the output node of the output circuit 91a used as an interface circuit in the IC 91 of 3.3V system via the bus line 93. Therefore, the output circuit 91a is required to have a withstanding voltage equal to or higher than 5V.

FIG. 2 shows an example of the construction of an output stage in the output circuit 91a of the IC 91 of 3.3V system in the circuit shown in FIG. 1. The circuit is constructed by a P-channel MOS transistor (which is hereinafter referred to as a PMOS transistor) P1, N-channel MOS transistor (which is hereinafter referred to as an NMOS transistor) N1, and depletion type NMOS transistor N2. The current paths of the PMOS transistor P1 and NMOS transistor N1 are serially connected between a power supply Vcc (=3.3V) and a ground terminal Vss. The gate potentials of the MOS transistors P1, N1 are selectively controlled by an output signal from the internal circuit, the output node Na is selectively set to one of the "H" level, "L" level and high impedance state, and thus they function as a tri-state buffer. The NMOS transistor N2 whose source-drain path is connected between the output node Na and an output terminal Nb of the IC 91 functions to separate the output node Na of the tri-state buffer from the IC 92-1 of 5V system, the gate thereof is connected to the power supply Vcc and the backgate thereof is fixed at the ground potential Vss.

The NMOS transistor N2 outputs a voltage near the power supply voltage Vcc to the output terminal Nb when the potential of the output node Na of the tri-state buffer is set at the "H" level. Therefore, if the threshold voltage of the NMOS transistor N2 is always kept at 0V, a voltage of 3.3V is output from the output node Nb of the IC 91. The NMOS transistor N2 must be so designed that, if 5V is applied to one end (output terminal Nb of the IC 91) of the current path of the NMOS transistor N2 via the bus line 93 when the output node Na of the tri-state buffer is set in the high impedance state, a voltage which is not higher than the withstanding voltage of an element of 3.3V system will not appear on the other end (output node Na of the tri-state buffer) of the current path. The reason is that, if a voltage which is higher than the withstanding voltage of the element of 3.3V system appears on the output node Na, an excessively high voltage is applied between the gate and drain of the NMOS transistor N1 since 3.3V is applied to the gate of the PMOS transistor P1 and 0V is applied to the gate of the NMOS transistor N1, and as a result, the reliability of the NMOS transistor N1 may be degraded and the gate insulation film may be destroyed. Therefore, it is necessary to suppress the potential of the node Na within a permitted voltage range.

Therefore, it becomes necessary to determine the threshold voltage of the depletion type NMOS transistor by taking the backgate Bias effect into consideration so as to satisfy the above two limitations, that is, the limitation that the power supply voltage Vcc is output from the output terminal Nb of the IC 91 when the potential of the node Na is at the "H" level and the limitation that the potential of the node Na is suppressed within the permitted voltage range if 5V is applied to the output terminal Nb of the IC 91 via the bus line when the node Na is set at the high impedance state.

Next, the threshold voltage Vthn2 of the NMOS transistor N2 is considered.

First, assume that the power supply voltage range of the 3.3V system is 3.3V±0.3V, the maximum value of the gate withstanding voltage of the element is 3.6V, and the range of a signal of 5V system supplied to the bus line 93 is 5.0V±0.5V. Further, assume that the input voltage range of a circuit portion which receives a signal appearing on the bus line 93 is defined by the TTL level ($V_H=2.0V$, $V_L=0.8V$). In this case, assume that $V_H=2.7V$ must be finally stably attained in a circuit portion for outputting a signal since a DC through current of a receiver side circuit becomes larger when $V_H=2.0V$. This is not a particular limitation. This is because the output voltage $V_{OH}$ of TTL is normally 2.7V.

Therefore, a voltage of 2.7V or more must be stably attained as the output voltage of the IC 91 when the potential of the node Na is at the "H" level. In the output mode of "H" level, the limitation becomes severest when an output voltage of 2.7V or more is stably attained in the case of the minimum power supply voltage level (3V) of 3.3V system, and the threshold voltage Vthn2 must be set equal to or lower than 0.3V when taking the backgate bias effect into consideration and if the substrate bias potential $V_{BS}$ is −2.7V.

Assuming now that the threshold voltage Vthn2 is changed by 0.3V for a variation of −1V in the substrate bias potential $V_{BS}$ as the backgate bias effect and if the threshold voltage of the depletion NMOS transistor N2 at the time of $V_{BS}=0V$ (in a state in which no backgate bias effect is present) is expressed by Vth($V_{BS}=0$), the following equation is obtained.

$$Vth(V_{BS}=0)+2.7V\times 0.3V=0.3V$$

That is, the relation of Vth($V_{BS}=0$)=−0.51V must be satisfied and a characteristic indicated by the solid line La can be obtained.

In contrast, when the potential of the node Na is at the "L" level, no problem concerning the threshold voltage Vthn2 occurs.

On the other hand, if 5V is applied to the output terminal Nb of the IC 91 via the bus line 93 when the node Na is set in the high impedance state, the potential of the node Na is pulled by the applied voltage and rises. At this time, if the withstanding voltage between the gate and drain of the NMOS transistor N1 is considered, the potential of the node Na must not be set equal to or higher than 3.6V. The potential Va of the node Na is controlled by the gate potential $V_{G2}$ of the depletion type NMOS transistor N2. That is, it rises to a potential to satisfy the relation of $V_{G2}-Va-Vthn2=0V$. Therefore, Vthn2=0V must be satisfied when $V_{G2}=3.6V$ and Va=3.6V. Further, it is necessary to satisfy the relation that Vth($V_{BS}=0$)+3.6V×0.3V=0V, that is, Vth($V_{BS}=0$)=−1.08V and a characteristic as indicated by the solid line Lb in FIG. 3 can be obtained.

As described above, the threshold voltage Vthn2 of the NMOS transistor N2 must lie in a region between the solid lines La and Lb shown in FIG. 3 and the margin of the threshold voltage Vthn2 is 0.57V.

Next, like the consideration for the 3.3V system, a case wherein the IC 91 having an output circuit shown in FIG. 2 is operated on a 3V system is considered. In this case, assume that the range of the power supply voltage of 3V system is 3.0V±0.3V, the maximum value of the gate withstanding voltage of the element is 3.6V, and the range of a signal of 5V system applied to the bus line is 5.0V±0.5V. In this case, a characteristic as indicated by a one-dot-dash line Lc in FIG. 3 can be obtained as the threshold voltage Vthn2 of the NMOS transistor N2 necessary for stably attaining an output voltage of 2.7V or more of the IC 91 when the potential of the node Na is at the "H" level. Further, characteristic as indicated by a two-dot-dash line Ld in FIG. 3 can be obtained as the threshold voltage Vthn2 necessary for suppressing the potential of the node Na to a value equal to or lower than 3.6V if 5V is applied to the output terminal Nb of the IC 91 via the bus line 93 when the node Na is set in the high impedance state.

When taking the above-described fact into consideration, the threshold voltage Vthn2 of the NMOS transistor N2 must be set within a range between the one-dot-dash line Lc and the two-dot-dash line Ld in FIG. 3 and the margin of the threshold voltage Vthn2 set at this time is 0.48V.

When considering the temperature dependency (−2 to −3 mV/°C.) of the threshold voltage Vthn2, a variation of approx. ±0.2V will occur with respect to a value obtained at the temperature of 25° C. in the temperature range of −40° C. to 85° C., for example, and therefore, it becomes necessary to precisely control the degree of process fluctuation of the threshold voltage Vthn2 in the 3.3V system and it is also necessary to further precisely control a variation in the threshold voltage Vthn2 in the 3V system.

Thus, the output circuit of the conventional IC shown in FIG. 2 has a disadvantage that the operation margin for a variation in the threshold voltage Vthn2 of the depletion type NMOS transistor N2 inserted for separation of the output node Na of the tri-state buffer from the bus line 93 is small and the process control is difficult.

SUMMARY OF THE INVENTION

Accordingly, a first object of this invention is to provide an interface circuit capable of enlarging the operation margin for a variation of the threshold voltage of a MOS transistor.

A second object of this invention is to provide an interface circuit capable of simplifying the process control.

A third object of this invention is to provide an interface circuit provided in the output stage of a circuit of low power supply voltage system formed in a semiconductor substrate and capable of enlarging the operation margin for a variation of the threshold voltage of a MOS transistor for separation from a circuit of high power supply voltage and simplifying the process control.

A fourth object of this invention is to provide an output circuit provided in the output stage of a circuit of low power supply voltage system formed in a semiconductor substrate and capable of enlarging the operation margin for a variation of the threshold voltage of a MOS transistor for separation from a circuit of high power supply voltage and simplifying the process control.

The first to third objects of this invention can be attained by an interface circuit comprising a MOS circuit formed in a semiconductor substrate; a first MOS transistor having a current path connected between an output node of the MOS circuit and an output terminal and a gate connected to a first potential supplying source; a first switching element connected between a backgate of the first MOS transistor and a second potential supplying source; a second MOS transistor having a current path connected at one end to the output terminal, a gate connected to the first potential supplying source and a backgate set at the same potential as that of the backgate of the first MOS transistor; and a second switching element connected between the backgate of the first MOS transistor and the other end of the current path of the second MOS transistor, the ON/OFF state thereof being controlled in a complementary state with respect to that of the first switching element.

With the above construction, a backgate bias can be selectively applied to the first MOS transistor by controlling the first and second switching elements according to the operation mode of the first MOS transistor. That is, if a signal of high power supply voltage system is supplied to the output terminal of the IC via the bus line of the exterior of the IC when the output node of the MOS circuit (for example, an output buffer circuit of the IC) is set in the high impedance state, the threshold voltage of the first MOS transistor is raised to a maximum by most effectively utilizing the backgate bias effect of the first MOS transistor in the operation mode in which a signal of high power supply voltage system is transmitted to the output node of the MOS circuit via the current path of the first MOS transistor so as to increase the transmitted signal voltage drop and suppress the potential of the output node of the MOS circuit to a preset value or less. In the operation mode in which the "H" level of the output of the MOS circuit is transmitted to the output terminal by the first MOS transistor, the backgate bias effect of the first MOS transistor is suppressed to a minimum so as to lower the threshold voltage of the first MOS transistor and reduce the output signal voltage drop to be transmitted. In the operation mode in which the "L" level of the output of the MOS circuit is transmitted to the output terminal by the first MOS transistor, a state in which the backgate bias effect of the first MOS transistor is suppressed to a minimum (substantially no difference occurs between the substrate bias and the source potential) so as to set up the same state as the normal "L" level transmission state.

As a result, the permissible range of the variations in the threshold voltages of the first and second MOS transistors can be enlarged and the operation margin for the variation in the threshold voltages can be significantly increased even if the process fluctuation and temperature dependency are taken into consideration. Thus, the process control can be simplified.

The fourth object of this invention can be attained by an output circuit comprising a MOS circuit formed in a semiconductor substrate and including a first MOS transistor and a second MOS transistor whose current paths are series-connected between a first potential supplying source and a second potential supplying source; a third MOS transistor of a first conductivity type having a current path connected at one end to a connection node between the first and second MOS transistors and connected at the other end to an output terminal and a gate connected to the first potential supplying source; a first switching element connected between a backgate of the third MOS transistor and the second potential supplying source; a fourth MOS transistor of the first conductivity type having a current path connected at one end to the output terminal, a gate connected to the first potential supplying source and a backgate set at the same potential as that of the backgate of the third MOS transistor; and a second switching element connected between the other end of the current path of the fourth MOS transistor and the backgate of the third MOS transistor, the ON/OFF state thereof being controlled in a complementary state with respect to that of the first switching element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a circuit diagram showing an example of the construction obtained when an interface circuit is provided in an output circuit of the IC, for illustrating an interface circuit according to a second embodiment of this invention;

FIG. 6 is a characteristic diagram for illustrating the margins of the threshold voltages of first and second NMOS transistors in the output circuit shown in FIG. 5;

DETAILED DESCRIPTION OF THE PREFERRED EMBODIMENTS

Figure 4:
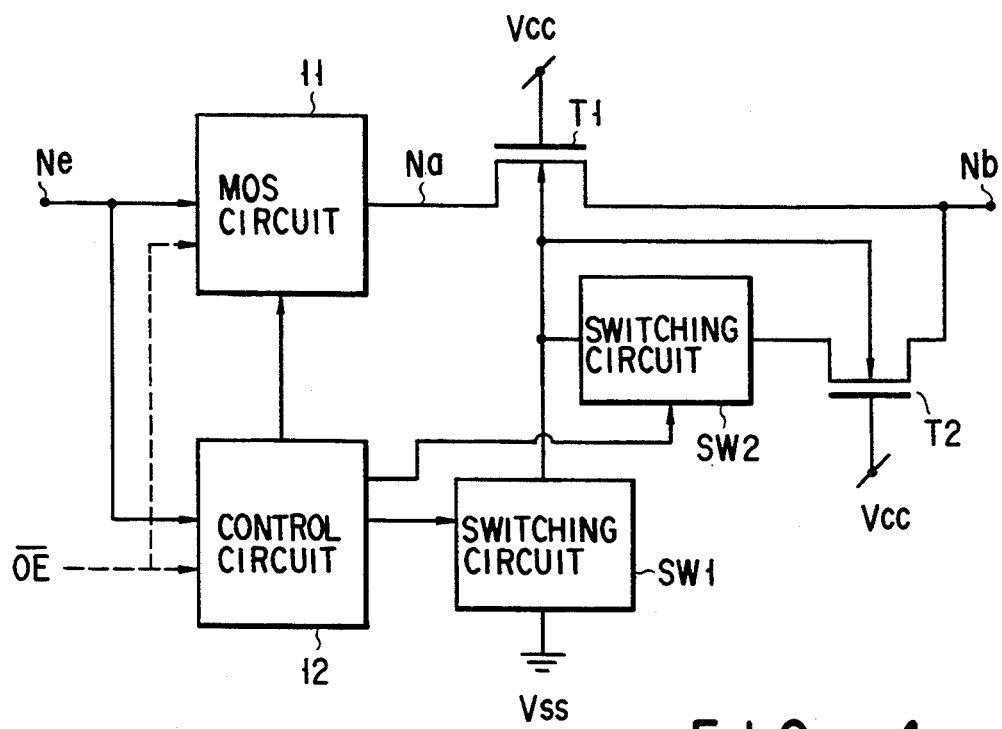
FIG. 4 is a circuit diagram showing a basic construction of an interface circuit according to a first embodiment of this invention.

FIG. 4 is a circuit diagram showing a basic construction of an interface circuit according to a first embodiment of this invention. This interface circuit is formed in a semiconductor substrate and includes a MOS circuit 11, first NMOS transistor T1 of depletion type, first switching element SW1, second switching element SW2, second NMOS transistor T2 of depletion type, and control circuit 12. An input node of the MOS circuit 11 is connected to an input terminal Ne. The source-drain path of the NMOS transistor T1 is connected between an output node Na of the MOS circuit 11 and an output terminal Nb and the gate thereof is connected to a first potential supplying source (for example, power supply Vcc). The switching element SW1 is inserted between the backgate (substrate region) of the NMOS transistor T1 and a second potential supplying source (for example, ground terminal Vss). One end of the current path of the NMOS transistor T2 is connected to the output terminal Nb, the gate thereof is connected to the power supply Vcc, and the backgate thereof is set at the same potential as that of the backgate of the NMOS transistor T1. The switching element SW2 is connected between the other end of the current path of the NMOS transistor T2 and the backgate of the NMOS transistor T1 and the ON/OFF state thereof is controlled in a complementary state with respect to that of the switching element SW1. The control circuit 12 generates a control signal in response to a signal input from the input terminal Ne to control the MOS circuit 11, first switching element SW1 and second switching element SW2. As shown by broken lines in FIG. 4, the control circuit 12 and MOS circuit 11 may be sometimes controlled by another control signal (for example, an output enable signal $\overline{OE}$) supplied from the exterior.

With the above construction, a backgate bias is selectively applied to the NMOS transistor T1 by controlling the ON/OFF state of the first and second switching elements SW1 and SW2 by the control circuit 12 according to the the operation mode of the NMOS transistor T1. That is, when the output node Na of the MOS circuit 11 is set in the high impedance state, a signal is supplied from a circuit of high power supply voltage system to the output terminal Nb, and when the NMOS transistor T1 is set in the operation mode for transmitting the signal to the output node Na of the MOS circuit 11, the backgate bias effect of the NMOS transistor T1 is set to a maximum by turning ON the switching element SW1 and turning OFF the switching element SW2. Thus, the threshold voltage of the NMOS transistor T1 is set to the maximum possible value to increase the voltage drop of the signal to be transmitted so as to suppress the potential of the output node Na of the MOS circuit 11 to a potential level equal to or lower than the breakdown voltage of an NMOS transistor which is provided in the output stage of the MOS circuit 11. Further, in the operation mode in which the NMOS transistor T1 transmits the "H" level of the output of the MOS circuit 11 to the output terminal Nb, occurrence of the backgate bias effect of the NMOS transistor T1 is prevented by turning ON the switching element SW2 and turning OFF the switching element SW1. Thus, the threshold voltage of the NMOS transistor T1 is lowered so that the voltage drop of the signal to be transmitted can be reduced. In the operation mode in which the NMOS transistor T1 transmits the "L" level of the output of the MOS circuit 11 to the output terminal Nb, a state in which substantially no backgate bias effect of the NMOS transistor T1 occurs (a state in which substantially no difference occurs between the substrate bias and the source potential occurs) is set up, and thus, substantially the same state as that set up at the time of normal transmission of "L" level is set up.

As a result, even if the process fluctuation and temperature dependency are taken into consideration, the permissible range of variations in the threshold voltages of the first and second MOS transistors can be enlarged and the operation margin for the variation in the threshold voltage can be significantly increased. Thus, the process control can be simplified.

Figure 1:
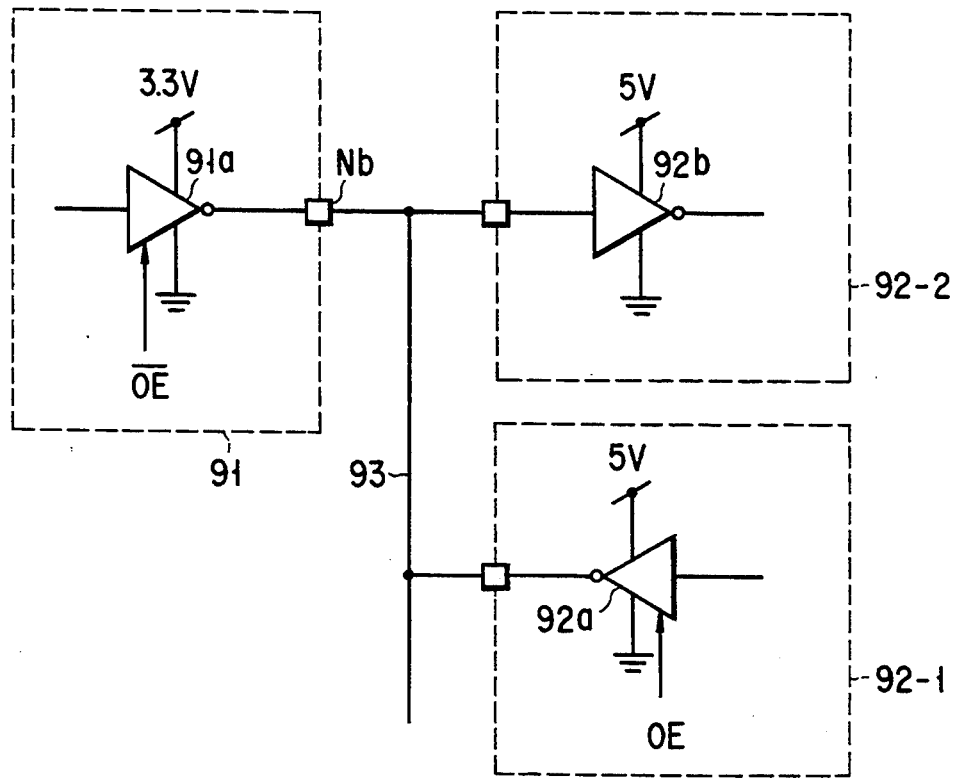
FIG. 1 is a block diagram showing a system in which an IC of low power supply voltage system and an IC of high power supply voltage system commonly use a bus line.
Figure 2:
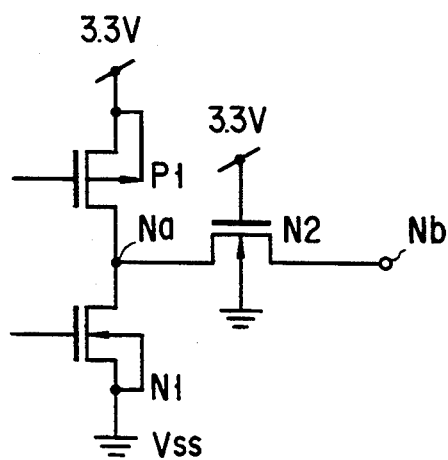
FIG. 2 is a circuit diagram showing an extracted output stage of the conventional IC of low power supply voltage system.

FIG. 5 illustrates an interface circuit according to a second embodiment of this invention in which the interface circuit shown in FIG. 4 is provided in the output circuit of the IC. The IC having the interface circuit formed therein is operated on a low power supply voltage (for example, 3.3V or 3V) system. Like the circuit shown in FIG. 1, the IC is connected to an IC of high power supply voltage (for example, 5V) system via a bus line and the reference potentials (ground potential Vss) thereof are the same. The interface circuit is formed in an N-type semiconductor substrate. A P well region, the source and drain regions of a PMOS transistor are formed in the substrate, and the source and drain regions of an NMOS transistor are formed in the P well region. Assume that the substrate is biased to the power supply potential Vcc and the P well region is biased to the ground potential Vss if no special explanation is made.

In the output circuit of FIG. 5, the output buffer circuit includes a PMOS transistor P1 and an NMOS transistor N1 serially connected between the power supply Vcc and the ground terminal Vss. The MOS transistors P1, N1 are controlled such that the output node Na will be set to the "H" level, "L" level or high impedance state by controlling the gate potentials thereof according to outputs of the NAND gate 13 and NOR gate 14 and thus construct a tri-state buffer circuit.

The source-drain path of a first NMOS transistor N2 of depletion type is connected between the output node Na of the tri-state buffer circuit and the output terminal Nb of the IC and the gate thereof is connected to the power supply Vcc. A first switching element SW1 is inserted between the backgate (node Nc) of the first MOS transistor N2 and the ground terminal Vss. Further, a second switching element SW2 and the source-drain path of a second NMOS transistor N3 of depletion type are series-connected between the backgate of the NMOS transistor N2 and the output terminal Nb of the IC. The ON/OFF state of the switching element SW2 is controlled in a complementary state with respect to that of the switching element SW1. Further, the second NMOS transistor N3 has a gate connected to the power supply Vcc and the backgate thereof is connected with the backgate of the NMOS transistor N2, for example, so as to be set at the same potential as that of the backgate of the NMOS transistor N2. A control signal CTRL is a 3.3V system signal and the ON/OFF state of the switching element SW1 is controlled according to the "H"/"L" level of the signal. Further, the ON/OFF state of the switching element SW2 is controlled according to the "L"/"H" level of control signals CTRL CTRLB.

As the first switching element SW1, a normally-OFF type NMOS transistor is used, for example, and the backgate thereof is connected to the ground terminal Vss. As the second switching element SW2, an analog switch constructed by a PMOS transistor P4 and an NMOS transistor N4 whose current paths are connected in parallel with each other is used. The gates of the MOS transistors P4, N4 are controlled by the control signals CTRL, CTRLB respectively. The backgate of the NMOS transistor N4 is connected to the ground terminal Vss.

In order to control the MOS transistors P4, N4, an output enable control signal $\overline{OE}$ and an input signal from the internal circuit are used. The signals IN and $\overline{OE}$ are supplied to a 2-input NOR gate 14 whose output is supplied to the gate of the NMOS transistor N1. The signal $\overline{OE}$ is inverted by an inverter 16 and an inverted signal OE and the input signal IN are supplied to a 2-input NAND gate 13. An output of the NAND gate 13 is supplied to the gate of the PMOS transistor P1. The signals OE and IN are supplied to a 2-input NAND gate 17 whose output is supplied to the gates of the MOS transistors N5, P4 as the signal CTRL. Further, the signal CTRL is inverted by an inverter 15 and then supplied to the gate of the NMOS transistors N4 as the control signal CTRLB.

Next, the operation of the output circuit shown in FIG. 5 is explained for three different operation modes.

(1) First Operation Mode

If a 5V system signal is supplied to the output terminal Nb of the IC via the external bus line when the output enable signal $\overline{OE}$ is set at the "H" level and the output node Na of the tri-state buffer is set in the high impedance state, the operation mode in which a signal of the output terminal Nb is transmitted to the output node Na of the tri-state buffer is set. In this operation mode, the first and second switching elements SW1 and SW2 are respectively set into the ON and OFF states so as to connect the node Nc to the ground terminal Vss and separate one end (node Nd) of the current path of the second NMOS transistor N3 from the node Nc.

In this switching state, the threshold voltage Vthn2 of the NMOS transistor N2 can be increased to the maximum possible value by most effectively using the backgate bias effect of the NMOS transistor N2 and the voltage drop of a signal to be transmitted is increased so that the potential of the output node Na of the tri-state buffer can be suppressed to a potential level equal to or lower than the breakdown voltage of the MOS transistor N1.

Further, it is necessary to prevent the maximum withstanding voltage 3.3V or more from being applied between the gate and drain of the NMOS transistor N3, but since the power supply voltage Vcc is applied to the gate, no problem occurs even if a 5V system signal is supplied to the output terminal Nb of the IC via the bus line in this operation mode.

In this case, since the switching element SW2 is set in the OFF state, the potential Vd of the node Nd is raised to a potential level expressed by the following equation.

$$Vd = Vcc - Vthn3$$

where Vthn3 is the threshold voltage of the second NMOS transistor N3.

Therefore, if the threshold voltage Vthn3 of the NMOS transistor N3 is set to be not higher than a preset value, the potential difference between Vd and the gate potential (in this example, ground potential Vss) of the NMOS transistor N4 constituting the switching element SW2 can be set equal to or less than 3.6V (maximum breakdown voltage).

Next, the threshold voltages Vthn2, Vthn3 of the NMOS transistor N2, N3 are considered.

First, assume a case wherein the range of the 3.3V system power supply voltage Vcc is 3.3V±0.3V, the maximum value of the gate withstanding voltage of the element is 3.6V, and the range of a 5V system signal supplied to the bus line is 5.0V±0.5V.

If 5V is applied to the output terminal Nb of the IC from the bus line when the node Na is set in the high impedance state, the potential of the node Na is raised by the applied voltage, but in this case, the potential of the node Na must be prevented from being set equal to or higher than 3.6V when taking the withstanding voltage between the gate and drain of the NMOS transistor N1 into consideration. The potential Va of the node Na is controlled by the gate potential $V_{G2}$ of the NMOS transistor N2. That is, it is raised to a potential which satisfies the following relation.

$$V_{G2} - Va - Vthn2 = 0V$$

Therefore, when $V_{G2} = Vcc = 3.6V$ and Va=3.6V, the relation of Vthn2≧0V must be satisfied. When the threshold voltage Vthn2 is not higher than 0V, Va will be set higher than 3.6V. If the threshold voltage of the first NMOS transistor N2 set when $V_{BS}=0V$ (no backgate bias effect is present) is expressed by Vthn2($V_{BS}=0$), it is necessary to satisfy the relation of Vthn2($V_{BS}=0$)+3.6V×0.3V=0V, that is, Vthn2($V_{BS}=0$) = −1.08V, and a characteristic as indicated by the solid line Lb in FIG. 6 can be obtained.

Further, the potential Vd of the node Nd is controlled by the gate potential $V_{G3}$ of the NMOS transistor N3. That is, it can be raised to a potential which satisfies the relation that $V_{G3}-Vd-Vthn3=0V$.

Therefore, when $V_{G3}=Vcc=3.6V$ and Vd=3.6V, the relation of Vthn3≧0V must be satisfied. If Vthn3<0V, Vd becomes higher than 3.6V and $V_{G3}$ becomes higher than 3.6V in the NMOS transistor N4 and exceeds the withstanding voltage of the NMOS transistor N4.

That is, the problem on the withstanding voltage can be solved by setting the characteristic (threshold voltage Vthn3, backgate bias effect) of the second NMOS transistor N3 equal to the characteristic of the first NMOS transistor N2.

As is understood from the above explanation, it is necessary to set the threshold voltages Vthn2, Vthn3 of the NMOS transistors N2, N3 in a region above the solid line Lb indicated in FIG. 6.

Next, the margins for the threshold voltages Vthn2, Vthn3 of the NMOS transistors N2, N3 set when the IC having the output circuit of FIG. 5 is operated on the 3V system power supply voltage are considered. In this case, assume that the range of the 3V system power supply voltage is 3.0V±0.3V, the maximum value of the gate withstanding voltage of the element is 3.6V, and the range of a 5V system signal supplied to the bus line is 5.0V±0.5V.

In this case, like the consideration for the 3.3V system described above, the relation of Vthn2≧ −0.3V must be satisfied when $V_{G2}=Vcc=3.3V$ and Va=3.3V. Therefore, it is necessary to set the threshold voltages Vthn2, Vthn3 in a region above the two-dot-dash line Ld shown in FIG. 6.

(2) Second Operation Mode

This is an operation mode in which the "H" level of the output node Na of the tri-state buffer is transmitted to the output terminal Nb of the IC. In this operation mode, the switching elements SW1, SW2 are respectively set in the OFF and ON states. As a result, the backgate (node Nc) of the NMOS transistor N2 is separated from the ground terminal Vss. Further, if the voltage drop in the switching element SW2 can be neglected, the potential of the node Nd of one end (which lies on the second switching element SW2 side) of the current path of the NMOS transistor N3 is set to the same potential of the node Nc. That is, the potential Vc of the node Nc, the potential Vd of the node Nd and the output voltage Vout are raised to values as indicated by the following equations.

$$Vout = Vcc - \{Vthn2(V_{BS}=0) + (Vout - Vc) \times 0.3\}$$

$$Vc = Vd = Vcc - Vthn3(V_{BS}=0)$$

By setting the potentials as described above, the NMOS transistor N2 may reduce the voltage drop of a signal to be transmitted and the output voltage Vout can be set to a level higher than the conventional case since the backgate bias effect of %he first NMOS transistor is smaller than the conventional case (the substrate bias potential $|V_{BS}|$ of the first NMOS transistor N2 is Vthn3).

Next, the threshold voltages Vthn2, Vthn3 of the NMOS transistors N2, N3 in the second operation mode are considered.

First, assume that the range of the 3.3V system power supply voltage is 3.3V±0.3V, the maximum value of the gate withstanding voltage of the element is 3.6V, and the range of a 5V system signal supplied to the bus line is 5.0V±0.5V.

Further, assume that the output voltage Vout of the IC must be stably set to be 2.7V or more in this operation mode. This stable setting becomes severest in the case of minimum power supply voltage level (3V) of 3.3V system. Further, assume that the characteristics (threshold voltages, backgate bias effects) of the NMOS transistors N2, N3 are set equal to each other.

If $Vthn2(V_{BS}=0) = Vthn3(V_{BS}=0)$ and the value thereof is expressed by Vthn0, the following equations can be attained.

$$Vc = Vd = Vcc - Vthn0$$

$$Vout = Vcc - Vthn0$$

The relation that Vout≧2.7V must be satisfied, but it becomes most difficult to raise the voltage when Vcc=3.0V.

As is understood from the above equations, the relation that Vd≧2.7V must be satisfied. At this time, Vthn0 must be set within a range of 0.3≧Vthn0.

That is, assuming that the threshold voltages Vthn2, Vthn3 vary by 0.3V for a variation of −1V in the substrate bias voltage $V_{BS}$ as the backgate bias effect, it becomes necessary to set the threshold voltages Vthn2, Vthn3 of the NMOS transistors in a region lying below the solid line La indicated in FIG. 6. Therefore, in the 3.3V system, the threshold voltages Vthn2, Vthn3 must be set in a range between the solid lines La and Lb shown in FIG. 6, the margin is 1.38V and is thus increased by 0.81V in comparison with the margin of 0.57V of the conventional case shown in FIG. 3.

Next, the margins of the threshold voltages Vthn2, Vthn3 of the NMOS transistors N2, N3 set when the IC having the output circuit of FIG. 5 is operated on the 3V power supply voltage system are considered. In this case, assume that the range of the 3V power supply voltage system is 3.0V±0.3V, the maximum value of the gate withstanding voltage of the element is 3.6V, and the range of a 5V system signal to be supplied to the bus line is 5.0V±0.5V.

In this case, like the consideration for the 3.3V system, it is necessary to set the threshold voltages Vthn2, Vthn3 in a region lying below the one-dot-dash line Lc shown in FIG. 6.

Figure 3:
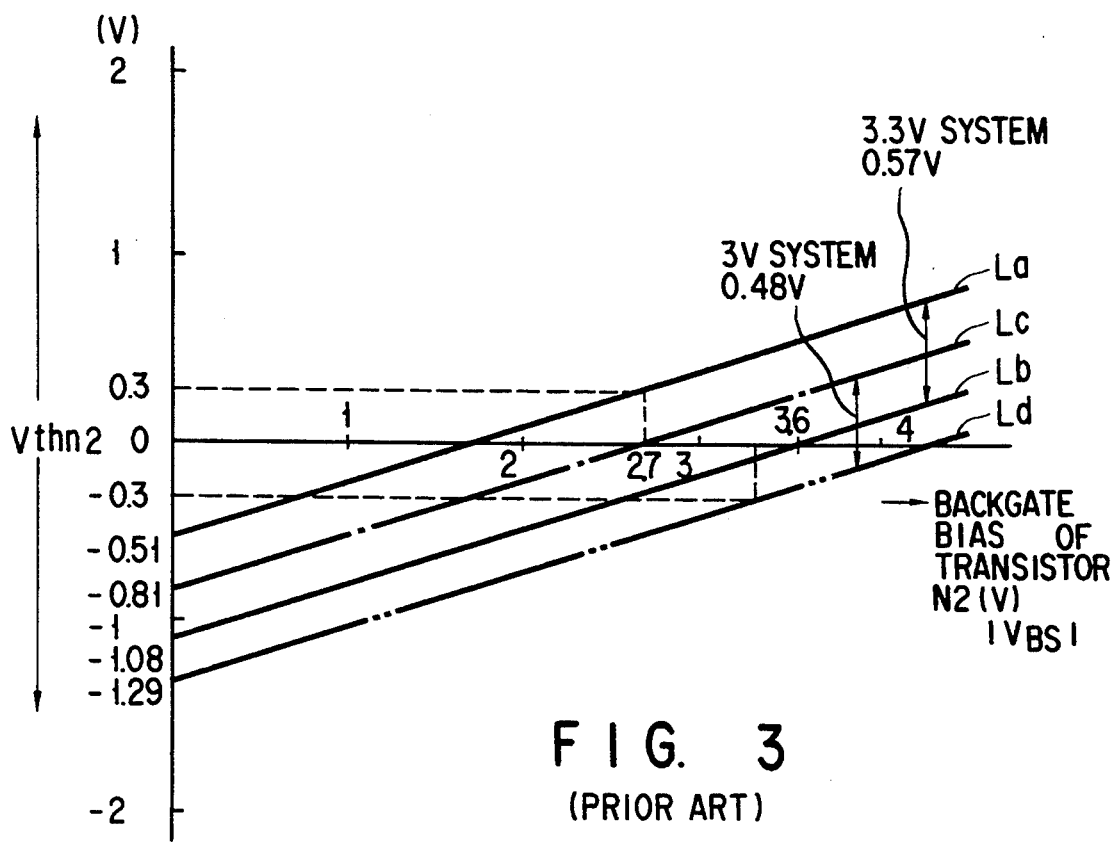
FIG. 3 is a characteristic diagram for illustrating the margin of the threshold voltage of an isolation NMOS transistor in the circuit shown in FIG. 2.

Therefore, in the 3V system, the threshold voltages Vthn2, Vthn3 must lie in a region between the one-dot-dash line Lc and the two-dot-dash line Ld shown in FIG. 6, and the margin is set to 1.29V and increased by 0.81V in comparison with the margin of 0.48V of the conventional interface circuit shown in FIG. 3.

(3) Third Operation Mode

This is an operation mode in which the "L" level (0V) of the output node Na of the tri-state buffer is transmitted to the output terminal Nb. In this operation mode, the node Nc is connected to the ground terminal Vss and the node Nd is separated from the node Nc by controlling the first and second switching elements SW1, SW2 into the ON and OFF states, respectively.

In this switching state, like the normal "L" level transmission operation, it becomes possible to transmit the "L" level without fail.

As described above, according to the output circuit of the second embodiment, since the switching elements SW1, SW2 are controlled according to the operation mode of the NMOS transistor N2 so as to control the bias of the backgate (P well region) of the NMOS transistor N2, it becomes possible to effectively apply a backgate bias to the NMOS transistor N2.

As a result, in either case of the 3.3V system and 3V system, the permissible range of variations in the threshold voltages Vthn2, Vthn3 of the NMOS transistors N2, N3 can be enlarged even when taking the process fluctuation and temperature dependency (−2 to 3 mV/°C.) into consideration. The operation margin for the variation in the threshold voltage can be increased twice as large as that of the conventional case and the process control can be simplified.

In the second embodiment, a case wherein the voltage drop in the switching element SW2 is as small as negligible is explained, but in the third embodiment, a case wherein the voltage drop in the switching element SW2 cannot be neglected is explained.

Figure 7:
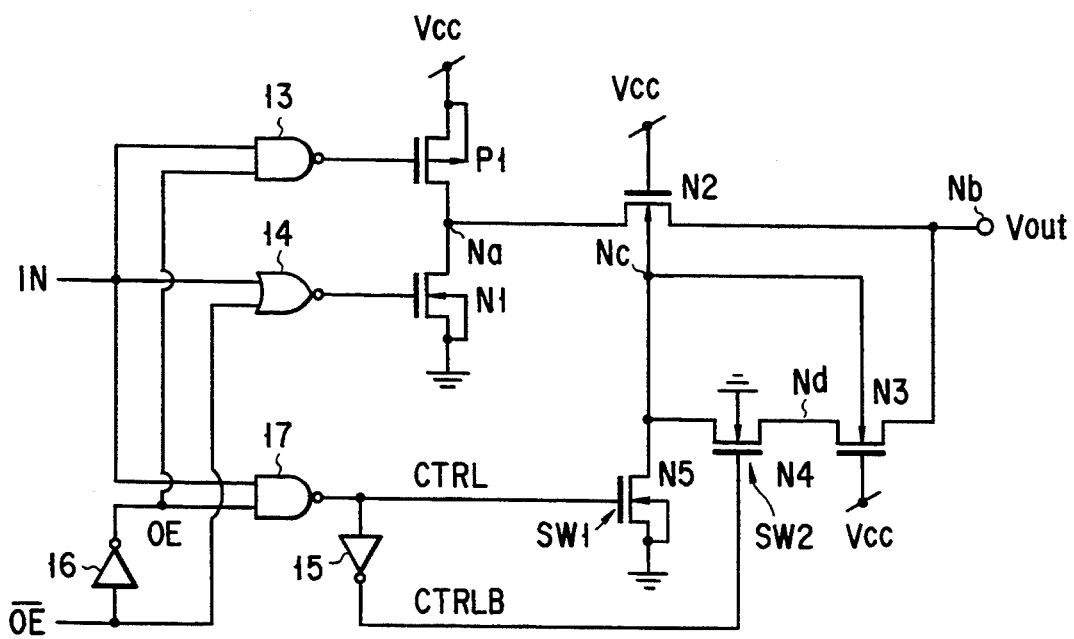
FIG. 7 is a circuit diagram showing another example of the construction obtained when an interface circuit is provided in an output circuit of the IC, for illustrating an interface circuit according to a second embodiment of this invention.

An output circuit shown in FIG. 7 is different from the output circuit shown in FIG. 5 in that only a normally OFF type NMOS transistor N4 is used as the switching element SW2 and the backgate of the NMOS transistor N4 is connected to the ground terminal Vss. The other construction is the same and like portions are denoted by the same reference numerals as those shown in FIG. 5.

The operation of the output circuit is basically the same as the operation of the output circuit of FIG. 5, but the potentials of the nodes Nc, Nd in the second operation mode in which the "H" level of the output node Na of the tri-state buffer is transmitted to the output terminal Nb of the IC are somewhat different.

That is, if the threshold voltage of the NMOS transistor N4 is expressed by Vth4, the potential Vc of the node Nc in the second operation mode is raised as indicated by the following equations.

$$Vc = Vcc - Vth4 \text{ (at the time of } Vth4 > Vth3)$$

$$Vc = Vcc - Vth3 \text{ (at the time of } Vth3 \geq Vth4)$$

In the case of Vth3≧Vth4, the circuit condition is the same as that set in the case wherein no voltage drop occurs in the MOS transistors N4 and P4 of FIG. 5 and no voltage drop occurs in the switching element SW2. In the case of Vth4>Vth3, since the potential Vd of the node Nd becomes higher than Vc, the circuit condition corresponds to that set in the case where a voltage drop occurs in the switching element SW2 of FIG. 5. If the threshold voltage Vth4 is adequately selected, a rise in the threshold voltage due to the backgate bias effect is made smaller than that in the conventional case in which the potential of the backgate (substrate region) of the first NMOS transistor N2 is fixed at the ground potential Vss so that the output voltage Vout will be set to a higher level than in the conventional case.

Now, the margins of the threshold voltages Vthn2, Vthn3, Vthn4 in the second operation mode are considered. In the following explanation, assume that the characteristics (threshold voltages, backgate bias effects) of the first NMOS transistor N2 and the second NMOS transistor N3 and third NMOS transistor N4 are set equal to each other.

The potentials Vout, Vc, Vd can be raised until the following relations are satisfied.

$$Vc = Vcc - \{Vthn4(V_{BS}=0) + Vc \times 0.3\}$$

$$Vd = Vcc - \{Vthn3(V_{BS}=0) + (Vd - Vc) \times 0.3\}$$

$$Vout = Vcc - \{Vthn2(V_{BS}=0) + (Vout - Vc) \times 0.3\}$$

Therefore, the following equations can be obtained.

$$Vc = \{Vcc - Vthn4(V_{BS}=0)\}/1.3$$

$$Vd = [Vcc - Vthn3(V_{BS}=0) + \{Vcc - Vthn4(V_{BS}=0)\} \times 0.3/1.3]/1.3$$

$$Vout = \{Vcc - Vthn2(V_{BS}=0) + Vc \times 0.3\}/1.3$$

If
$Vthn2(V_{BS}=0) = Vthn3(V_{BS}=0) = Vthn4(V_{BS}=0)$ and the value thereof is expressed by Vthn0, the following equations can be obtained.

$$Vc = (Vcc - Vthn0)/1.3$$

$$Vd = (Vcc - Vthn0) \times 1.6/1.69$$

$$Vcc = (Vcc - Vthn0) \times 1.6/1.69$$

The relation of Vout≧2.7V must be satisfied, but it becomes most difficult to raise the voltage when Vcc=3.0V in the 3.3V system.

From the above equations, the relation Vd≧2.7V must be satisfied. At this time, it is necessary to set the threshold voltage Vthn0 within the range of 0.148≧Vthn0. In this case, Vc≧2.194V.

In the 3.0V system, it is most difficult to raise the potential when Vcc=2.7V.

From the above equations, the relation of Vd≧2.7V must be satisfied. At this time, it is necessary to set the threshold voltage Vthn0 within the range of −0.152≧Vthn0. In this case, Vc≧2.194V.

As described above, it is necessary to set the threshold voltages Vthn2, Vthn3, Vthn4 of the NMOS transistors N2, N3, N4 in a region lying below the solid line La of FIG. 8 in the 3.3V system.

In contrast, in the 3V system described before, it is necessary to set the threshold voltages Vthn2, Vthn3, Vthn4 in a region lying below the one-dot-dash line Lc shown in FIG. 8.

In the first operation mode, the margins of the threshold voltages Vthn2, Vthn3 of the NMOS transistors N2, N3 are set to the same values as in the circuit of FIG. 5. Therefore, in the 3.3V system, the threshold voltages Vthn2, Vthn3, Vthn4 must be set in a region between the solid lines La and Lb shown in FIG. 8 and the margin is set to 1.23V and increased by 0.66V in comparison with the margin of 0.57V of the conventional output circuit shown in FIG. 3.

Figure 8:
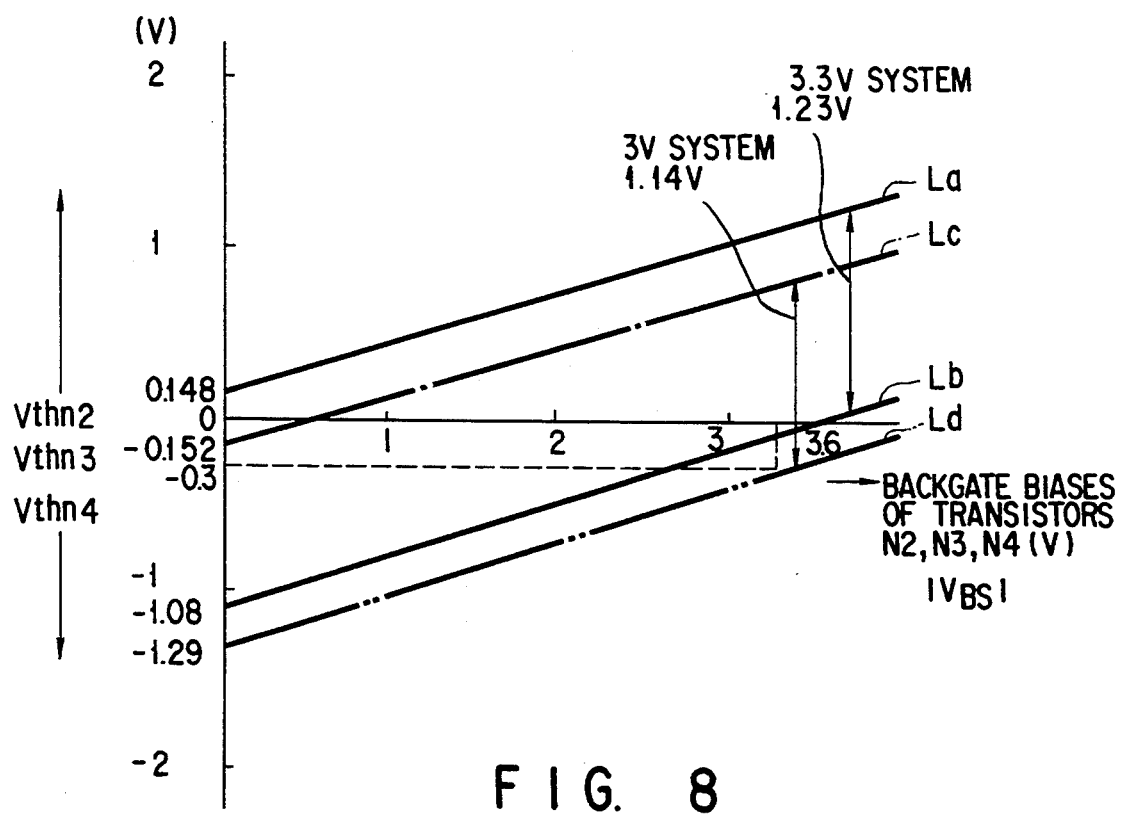
FIG. 8 is a characteristic diagram for illustrating the margins of the threshold voltages of first to third NMOS transistors in the output circuit shown in FIG. 7.

Further, in the 3V system, the threshold voltages Vthn2, Vthn3, Vthn4 must be set in a region between the one-dot-dash line Lc and the two-dot-dash line Ld shown in FIG. 8 and the margin is set to 1.14V and increased by 0.66V in comparison with the margin of 0.48V of the conventional output circuit shown in FIG. 3.

Figure 9:
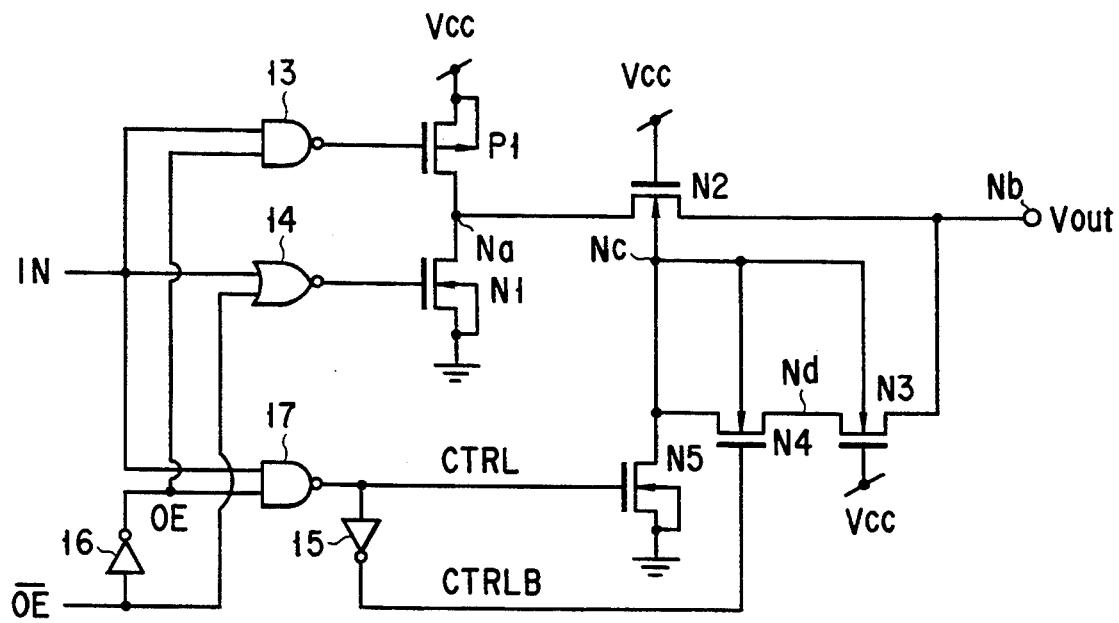
FIG. 9 is a circuit diagram showing a modification of the output circuit of FIG, 7, for illustrating an interface circuit according to a fourth embodiment of this invention.

FIG. 9 shows a modification of the output circuit shown in FIG. 7. The output circuit is similar to the output circuit of FIG. 7 except that the backgate of an NMOS transistor N4 used as the second switching element is connected to the node Nc so that the potentials thereof can be kept at the same potential level (in an example of FIG. 9, the backgates of first and second NMOS transistors N2 and N3 are connected together).

The operation of the output circuit is basically the same as the operation of the output circuit of FIG. 7, but since no backgate bias is applied to the NMOS transistor N4, the voltage drop thereof is reduced by a corresponding amount, and therefore, the margins for the threshold voltages Vthn2, Vthn3, Vthn4 of the NMOS transistors N2, N3, N4 can be improved.

That is, if the threshold voltage of the NMOS transistor N4 is expressed by Vth4, the potential Vc of the node Nc in the second operation mode is raised to a value expressed by the following equations.

$$Vc = Vcc - Vth4 \text{ (at the time of } Vth4 > Vth3)$$

$$Vc = Vcc - Vth3 \text{ (at the time of } Vth3 \geq Vth4)$$

In the case of Vth3≧Vth4, the circuit condition is the same as that set in a case where no voltage drop occurs in the switching element SW2. In the case of Vth4>Vth3, since the potential Vd of the node Nd becomes higher than Vc, the circuit condition corresponds to that set in a case where a voltage drop occurs in the switching element SW2 of FIG. 5. If the threshold voltage Vth4 is adequately selected, a rise in the threshold voltage due to the backgate bias effect is made smaller than that in the conventional case in which the potential of the backgate of the first NMOS transistor N2 is fixed at the ground potential Vss so that the output voltage Vout will be set to a higher level in comparison with the conventional case.

Now, the margins of the threshold voltages Vthn2, Vthn3, Vthn4 in the second operation mode are considered. In the following explanation, assume that the characteristics (threshold voltages, backgate bias effects) of the first NMOS transistor N2 and the second NMOS transistor N3 and third NMOS transistor N4 are set equal to each other.

The potentials Vout, Vc, Vd can be raised until the following relations are satisfied.

$$Vc = Vcc - Vthn4(V_{BS}=0)$$

$$Vd = Vcc - \{Vthn3(V_{BS}=0) + (Vd - Vc) \times 0.3\}$$

$$Vout = Vcc - \{Vthn2(V_{BS}=0) + (Vout - Vc) \times 0.3\}$$

Therefore, the following equations can be obtained.

$$Vc = Vcc - Vthn4(V_{BS}=0)$$

$$Vd = [Vcc - Vthn3(V_{BS}=0) + \{Vcc - Vthn4(V_{BS}=0)\} \times 0.3]/1.3$$

$$Vout = \{Vcc - Vthn2(V_{BS}=0) + Vc \times 0.3\}/1.3$$

If
$Vthn2(V_{BS}=0) = Vthn3(V_{BS}=0) = Vthn4(V_{BS}=0)$ and the value thereof is expressed by Vthn0, the following equation can be obtained.

$$Vc = Vd = Vout = Vcc - Vthn0$$

The relation of Vout≧2.7V must be satisfied, but it becomes most difficult to raise the potential when Vcc=3.0V in the 3.3V system.

From the above equation, the relation Vd≧2.7V must be satisfied. At this time, it is necessary to set the threshold voltage Vthn0 within the range of 0.3≧Vthn0.

In the 3.0V system, it becomes most difficult to raise the potential when Vcc=2.7V. From the above equations, the relation of Vd≧2.7V must be satisfied. At this time, it is necessary to set the threshold voltage Vthn0 within the range of 0≧Vthn0.

As described above, it is necessary to set the threshold voltages Vthn2, Vthn3, Vthn4 in a region lying below the solid line La of FIG. 6 (in the 3.3V system) and the one-dot-dash line Lc (in the 3.0V system).

In the first operation mode, the margins of the threshold voltages Vthn2, Vthn3 are set to the same values as in the circuit of FIG. 6.

Therefore, in the 3.3V system, the threshold voltages Vthn2, Vthn3, Vthn4 must be set in a region between the solid lines La and Lb shown in FIG. 6 and the margin is set to 1.38V and increased by 0.81V in comparison with the margin of 0.57V of the conventional output circuit shown in FIG. 3.

Further, in the 3V system, the threshold voltages Vthn2, Vthn3, Vthn4 must be set in a region between the one-dot-dash line Lc and the two-dot-dash line Ld shown in FIG. 6 and the margin is set to 1.29V and increased by 0.81V in comparison with the margin of 0.48V of the conventional output circuit shown in FIG. 3.

Figure 10:
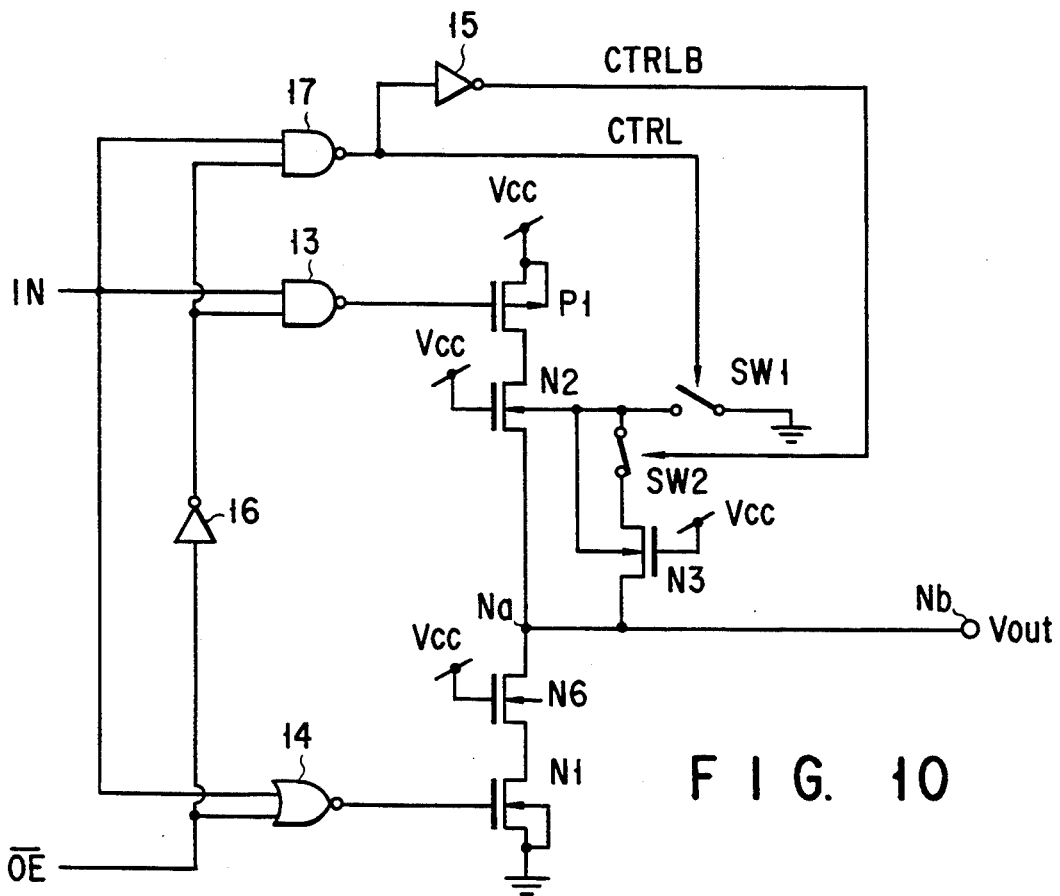
FIG. 10 is a circuit diagram showing still another example of the construction obtained when an interface circuit is provided in an output circuit of the IC, for illustrating an interface circuit according to a fifth embodiment of this invention.

FIG. 10 is a circuit diagram for illustrating an interface circuit according to a fifth embodiment of this invention and shows the construction obtained when the interface circuit is provided in the output circuit of the IC as in the case of the second to fourth embodiments. In the output circuit, the current paths of an NMOS transistor N2 whose gate is connected to the power supply Vcc and an NMOS transistor N6 whose gate is connected to the power supply Vcc are series-connected between the PMOS transistor P1 and the NMOS transistor N1 of the output circuit shown in FIG. 5. The connection of the NMOS transistor N3, switching elements SW1, SW2 with the NMOS transistor N2 is the same as in the case of former embodiments.

In the output circuit of FIG. 10, since the current path of the NMOS transistor N6 is connected between the drain of the NMOS transistor N1 and the output terminal Nb of the IC and the gate thereof is connected to the power supply Vcc, it becomes possible to prevent a high voltage from being applied between the drain and gate of the NMOS transistor N1 when a 5V system signal is supplied to the output terminal Nb of the IC, thus making it possible to effectively protect the NMOS transistor N1.

In the circuit of FIG. 10, the backgate of the NMOS transistor N3 is connected to the backgate of the NMOS transistor N2 to set the substrate potentials of the NMOS transistors N3 and N2 to the same potential level, but it will be clearly understood from the explanation with reference to FIGS. 7 and 9 that the backgate of the NMOS transistor N3 may be connected to the ground terminal Vss.

Figure 11:
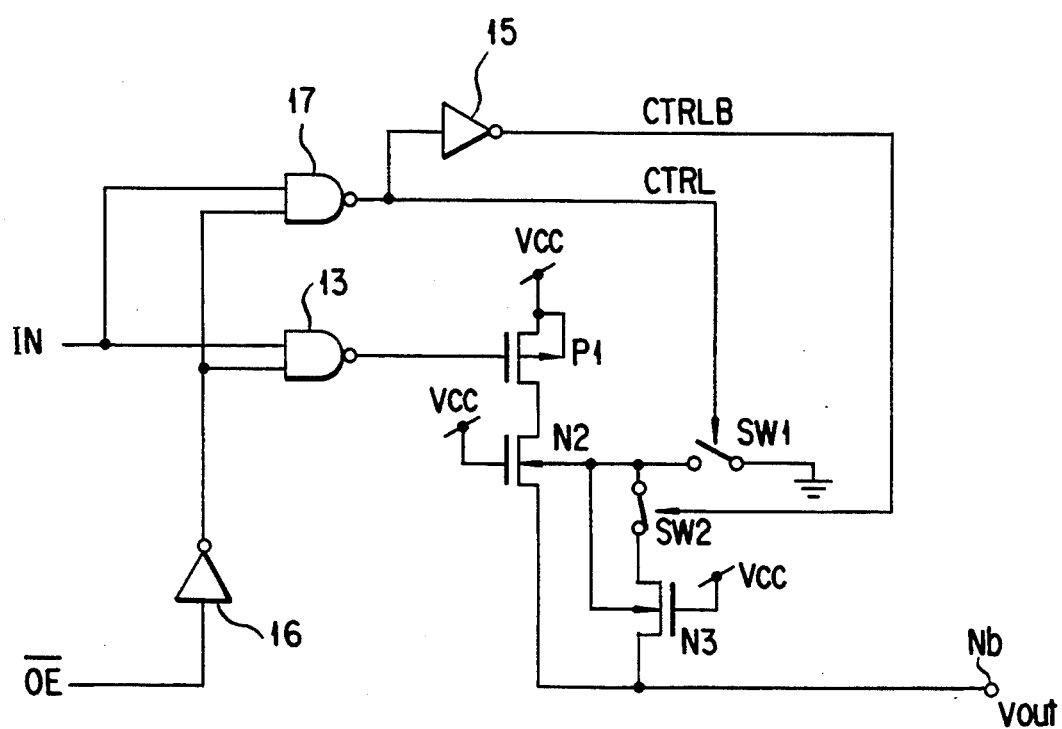
FIG. 11 is a circuit diagram showing other example of the construction obtain when an interface circuit is provided in an output circuit of the IC, for illustrating an interface circuit according to a sixth embodiment of this invention.

If, as shown in FIG. 11, the NMOS transistors N1 and N6 and the NOR gate 14 are removed from the circuit shown in FIG. 10, the circuit obtained thereby can be used as a pull-up circuit for pulling up the potential at output terminal Nb.

Figure 12:
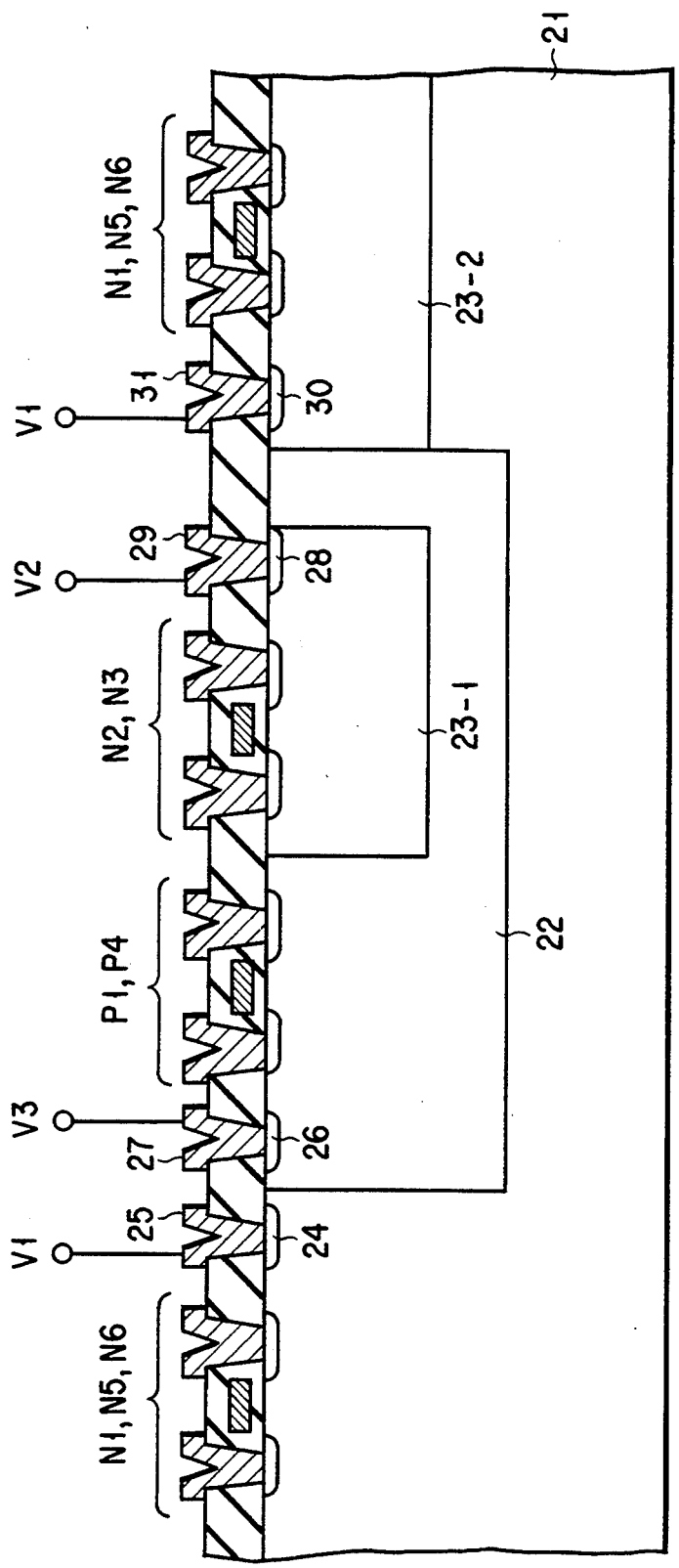
FIG. 12 is a cross sectional view showing the construction obtained when an interface circuit is provided in an IC of triple well structure, for illustrating an interface circuit according to a seventh embodiment of this invention.

Further, in the above embodiments, a case wherein the potential of the P well region is controlled in the IC having the P well region formed in the N-type semiconductor substrate is explained, but this invention is not limited to the above embodiments and can be applied to an IC having a triple well structure as shown in FIG. 12. In the triple well structure, an N well region 22 is first formed in a P-type semiconductor substrate 21. Next, P well regions 23-1, 23-2 are respectively formed in the N well region 22 and substrate 21. In the substrate 21, NMOS transistors N1, N5, N6 are formed. Further, in the substrate 21, a P+-type impurity diffused layer 24 is formed to permit a bias voltage V1, for example, ground potential Vss to be applied to the substrate 21 via an electrode 25. In the N well region 22, PMOS transistors P1, P4 are formed. Further, in the N well region 22, an N+-type impurity diffused layer 26 is formed to permit a bias voltage V3, for example, power supply potential Vcc to be applied to the N well region 22 via an electrode 27. In the P well region 23-1, NMOS transistors N2, N3 are formed. The P well region 23-1 has a P+-type impurity diffusion layer 28 formed therein. A bias voltage V2, controlled by means of switches SW1 and SW2, is applied to the P well region 23-1 by way of electrode 29. The P well region 23-1 corresponds to node Nc depicted in the circuit diagram. In the P well region 23-2, NMOS transistors N1, N5, N6 are formed. The NMOS transistors N1, N5, N6 may be formed in the substrate 21 as described before or they may be separately formed in the substrate 21 and the P well region 23-2. Further, in the P well region 23-2, an N+-type impurity diffused layer 30 is formed to permit the bias voltage V1, for example, power supply potential Vcc to be applied to the P well region 23-2 via an electrode 31.

The NMOS transistor N4 can be formed in one or both of the substrate 21 and the P well region 23-2 when the ground potential Vss is applied to the backgate thereof. When the backgate thereof is connected with the backgate of the NMOS transistor N2, it may be formed in the P well region 23-1.

With the above construction, most of the NMOS transistors can be formed in the P well region 23-2 or P-type semiconductor substrate 21, but it is necessary to form the NMOS transistors N2, N3 (and N4 when the backgate of the NMOS transistor N4 is connected to the backgate of the NMOS transistor N2) and other NMOS transistors N1, N5, N6 in a different well region (or substrate). Further, the PMOS transistors are formed in the N well region 22 in which the P well region 23-1 is formed, but it is also possible to form an additional N well region having no P well region formed therein and form the PMOS transistors in the additionally formed N well region.

In the above embodiments, a case wherein the tri-state buffer is formed as the output buffer circuit is explained, but this invention can be applied to a CMOS inverter whose output has two values of "H" level and "L" level (having no high impedance state). In the case of CMOS inverter, the limitations indicated by the solid line Lb, two-dot-dash line Ld shown in FIG. 6 and the solid line Lb, two-dot-dash line Ld shown in FIG. 8 are eliminated.

In FIGS. 5, 7 and 9, the output terminal of the tri-state buffer is connected to the node Na, but this invention is effective when the output terminal of another circuit (such as a NAND gate, NOR gate, exclusive-OR gate, analog switching circuit) is connected to the node.

In the explanation for the above embodiments, the effect of this invention is explained by taking into consideration the two limitations, that is, the limitation that a voltage (for example, 2.7V) approximately equal to the power supply voltage Vcc is applied to the output terminal Nb when the potential of the node Na is set at the "H" level and the limitation that the voltage of the node Na is suppressed within the range of the gate withstanding voltage if 5V is applied to the output terminal Nb from the bus line when the node Na is set in the high impedance state. However, the nodes Na, Nd of the circuit shown in FIG. 5 are respectively connected to the PMOS transistors P1, P4 and a parasitic diode constructed by a P-type impurity diffused layer forming the source and drain regions and an N-type impurity diffused layer biased by the power supply Vcc is present. For example, at the time of power supply voltage Vcc=3.0V, the parasitic diode may be biased in a forward direction in some cases if the range of the threshold voltage is determined on the assumption that 3.6V which is the withstanding voltage of the device is the maximum permissible application voltage of the node Na. At this time, a forward current flows in the parasitic diode, but the current is not always fatal, and therefore, it is not dealt as the limitation in the explanation of the above embodiments.

If the above limitation is taken into consideration, the range of the threshold voltage is determined as follows.

(1) 3.3V System

At the time of Vcc=3.0V, the relation that threshold voltage Vthn2=0V must be satisfied, and therefore, the solid line Lb is shifted in an upward direction in FIGS. 6, 8 and 3. At this time, the control range of the threshold voltage Vthn is set as follows.

In the conventional case: 0.39V
In the case of the circuits of FIGS. 5 and 9: 1.2V
In the case of the circuit of FIG. 7: 1.048V (2) 3.0V System At the time of Vcc=2.7V, the relation that threshold voltage Vthn2=0V must be satisfied, and therefore, the two-dot-dash line Ld is shifted in an upward direction in FIGS. 6, 8 and 3. At this time, the control range of the threshold voltage Vthn is set as follows.

In the conventional case: 0V
In the case of the circuits of FIGS. 5 and 9: 0.81V
In the case of the circuit of FIG. 7: 0.66V If the limitation that the forward current in the parasitic diode is eliminated is additionally imposed, the range of the threshold voltage Vth is further narrowed, but it can be significantly improved over the conventional case.

Further, in the above embodiments, the gate of the first MOS transistor N2 is connected to the power supply Vcc, but the range of the threshold voltage Vth can be enlarged in comparison with the conventional system even when it is connected to a power supply node having a different voltage value (for example, Vee).

As described above, according to this invention, it is possible to provide an interface circuit and an output circuit in which the operation margin for a variation in the threshold voltage of a MOS transistor for separation of a signal from the circuit of high power supply voltage system provided in the output stage of the circuit of low power supply voltage system can be significantly enlarged and the process control can be simplified.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An interface circuit comprising:
   a MOS circuit formed in a semiconductor substrate;
   a first MOS transistor having a current path connected between an output node of said MOS circuit and an output terminal and a gate connected to a first potential supplying source;
   a first switching element connected between a backgate of said first MOS transistor and a second potential supplying source;
   a second MOS transistor having a current path connected at one end to said output terminal, a gate connected to said first potential supplying source and a backgate set at the same potential as that of the backgate of said first MOS transistor; and
   a second switching element connected between the backgate of said first MOS transistor and the other end of the current path of said second MOS transistor, the ON/OFF state thereof being controlled in a complementary state with respect to that of said first switching element.

2. An interface circuit according to claim 1, wherein said second switching element is a switch having a P-channel MOS transistor and an N-channel MOS transistor whose current paths are connected in parallel with each other and whose gates are controlled by a control signal.

3. An interface circuit according to claim 1, wherein said first switching element includes a third MOS transistor whose current path is connected between the backgate of said first MOS transistor and said second potential supplying source and whose backgate is connected to said second potential supplying source, and said second switching element includes a fourth MOS transistor whose current path is connected between the backgate of said first MOS transistor and the other end of the current path of said second MOS transistor and whose backgate is connected to said second potential supplying source.

4. An interface circuit according to claim 1, wherein said first switching element includes a third MOS transistor whose current path is connected between the backgate of said first MOS transistor and said second potential supplying source and whose backgate is connected to said second potential supplying source, and said second switching element includes a fourth MOS transistor whose current path is connected between the backgate of said first MOS transistor and the other end of the current path of said second MOS transistor and whose backgate is connected to the backgate of said first MOS transistor.

5. An interface circuit according to claim 1, wherein said first and second MOS transistors are of N-channel type.

6. An interface circuit according to claim 1, wherein said MOS circuit includes an output stage having a tri-state buffer.

7. An interface circuit according to claim 1, wherein said MOS circuit includes an output stage having a CMOS inverter.

8. An interface circuit according to claim 1, further comprising a control circuit for controlling the ON/OFF states of said first and second switching elements into complementary states according to the output state of said MOS circuit.

9. An interface circuit according to claim 8, wherein said control circuit controls the ON/OFF states of said first and second switching elements into complementary states in response to an output enable signal and a signal for determining an output level of said MOS circuit.

10. An output circuit comprising:
a MOS circuit formed in a semiconductor substrate and including a first MOS transistor and a second MOS transistor whose current paths are series-connected between a first potential supplying source and a second potential supplying source;
a third MOS transistor of a first conductivity type having a current path connected at one end to a connection node between said first and second MOS transistors and connected at the other end to an output terminal and a gate connected to said first potential supplying source;
a first switching element connected between a backgate of said third MOS transistor and said second potential supplying source;
a fourth MOS transistor of the first conductivity type having a current path connected at one end to said output terminal, a gate connected to said first potential supplying source and a backgate set at the same potential as that of the backgate of said third MOS transistor; and
a second switching element connected between the other end of the current path of said fourth MOS transistor and the backgate of said third MOS transistor, the ON/OFF state thereof being controlled in a complementary state with respect to that of said first switching element.

11. An output circuit according to claim 10, wherein said second switching element is a switch having a MOS transistor of a second conductivity type and a MOS transistor of the first conductivity type whose current paths are connected in parallel with each other and whose gates are controlled by a control signal.

12. An output circuit according to claim 10, wherein said first switching element includes a fifth MOS transistor of the first conductivity type whose current path is connected between the backgate of said third MOS transistor and said second potential supplying source and whose backgate is connected to said second potential supplying source, and said second switching element includes a sixth MOS transistor of the first conductivity type whose current path is connected between the backgate of said third MOS transistor and the other end of the current path of said fourth MOS transistor and whose backgate is connected to said second potential supplying source.

13. An output circuit according to claim 10, wherein said first switching element includes a fifth MOS transistor of the first conductivity type whose current path is connected between the backgate of said third MOS transistor and said second potential supplying source and whose backgate is connected to said second potential supplying source, and said second switching element includes a sixth MOS transistor of the first conductivity type whose current path is connected between the backgate of said third MOS transistor and the other end of the current path of said fourth MOS transistor and whose backgate is connected to the backgate of said third MOS transistor.

14. An output circuit according to claim 10, wherein said first potential supplying source is a power supply and said second potential supplying source is a ground terminal.

15. An output circuit according to claim 10, further comprising a control circuit for controlling the ON/OFF states of said first and second switching elements into complementary states according to the output state of said MOS circuit.

16. An output circuit according to claim 15, wherein said control circuit controls the ON/OFF states of said first and second switching elements into complementary states in response to an output enable signal and a signal from an internal circuit for determining an output level of said MOS circuit.

17. An output circuit comprising:
a first MOS transistor of a first conductivity type having a current path connected at one end to a first potential supplying source;
a second MOS transistor of a second conductivity type whose current path is connected between the other end of the current path of said first MOS transistor and an output terminal and whose gate is connected to said first potential supplying source;
a third MOS transistor of the second conductivity type having a current path connected at one end to said output terminal, a gate connected to said first potential supplying source, and a backgate set at the same potential as said second MOS transistor;
a first switching element connected between the backgate of said second MOS transistor and a second potential supplying source; and
a second switching element connected between the backgate of said second MOS transistor and the other end of the current path of said third MOS transistor, the ON/OFF state thereof being controlled in a complementary state with respect to that of said first switching element.

18. An output circuit according to claim 17, further comprising a fourth MOS transistor of the second conductivity type having a current path connected at one end to a second potential supplying source, and a fifth MOS transistor of the second conductivity type having a current path connected between the other end of the current path of said fourth MOS transistor and said output terminal.

19. An output circuit according to claim 17, further comprising a control circuit for controlling the ON/OFF states of said first and second switching elements.

20. An output circuit according to claim 19, wherein said control circuit controls the ON/OFF states of said first and second switching elements into complementary states in response to an output enable signal and a signal supplied from an internal circuit.

21. An output circuit according to claim 11, wherein said first conductivity type is an N-conductivity type and said second conductivity type is a P-conductivity type, said first potential supplying source is a power supply, and said second potential supplying source is a ground terminal.

22. An output circuit according to claim 12, wherein said first conductivity type is an N-conductivity type, said first potential supplying source is a power supply, and said second potential supplying source is a ground terminal.

23. An output circuit according to claim 13, wherein said first conductivity type is an N-conductivity type, said first potential supplying source is a power supply, and said second potential supplying source is a ground terminal.

24. An interface circuit comprising:
a MOS circuit with an output node;
an output terminal;
a first potential supplying source;
a second potential supplying source;
a first MOS transistor having a first terminal connected to said output node of said MOS circuit, a second terminal connected to said output terminal, a gate connected to said first potential supplying source, and a backgate;
a first switching element having a conducting state and a non-conducting state, said first switching element connected between said backgate of said first MOS transistor and said second potential supplying source, wherein when said first switching element is in said conducting state, said backgate of said first MOS transistor assumes the potential of said second potential supplying source;
a second MOS transistor having a first terminal connected to said output terminal, a second terminal, a gate connected to said first potential supplying source and a backgate set at the same potential as that of said backgate of said first MOS transistor;
a second switching element having a conducting state and a non-conducting state, said second switching element connected between said backgate of said first MOS transistor and said second terminal of said second MOS transistor; and
controlling means controlling said second switching element such that when said first switching element is in one of said conducting or non-conducting states, said second switching element is in the other of said conducting or non-conducting states.

* * * * *